United States Patent [19]
Estrick et al.

[11] Patent Number: 5,268,657
[45] Date of Patent: Dec. 7, 1993

[54] HIGH PERFORMANCE OSCILLATOR CIRCUIT WITH MINIMUM FREQUENCY PULLING AT POWER ON

[75] Inventors: Vaughn H. Estrick; John P. Safford, both of Fullerton, Calif.

[73] Assignee: Hughes Aircraft Company, Los Angeles, Calif.

[21] Appl. No.: 911,423

[22] Filed: Jul. 10, 1992

[51] Int. Cl.[5] .............................................. H03B 5/36
[52] U.S. Cl. .................................. 331/75; 331/116 R; 331/158
[58] Field of Search .............. 331/75, 116 R, 116 FE, 331/158, 159

[56] References Cited

U.S. PATENT DOCUMENTS 4,570,132  2/1986  Driscoll .................. 331/116 R X
4,593,256  6/1986  Bickley ...................... 331/117 R
5,166,647  11/1992  Riebman .......................... 331/107 S Primary Examiner—Siegfried H. Grimm
Attorney, Agent, or Firm—Wanda K. Denson-Low

[57] ABSTRACT

A high performance oscillator with low frequency pulling at turn on includes an oscillator transistor, a resonating element and a common base buffer transistor. The resonating element of the oscillator is a circuit having a crystal resonator that is connected in parallel with a transformer winding. This resonating element is connected between the emitter of the oscillator transistor and the emitter of the buffer transistor. More specifically, a tap connects the emitter of the buffer transistor to the transformer winding of the resonating element. With this connection, a low transformed power oscillating output is taken from the collector of the buffer transistor with minimized degradation in the symbol of merit for the crystal oscillator.

19 Claims, 1 Drawing Sheet

HIGH PERFORMANCE OSCILLATOR CIRCUIT WITH MINIMUM FREQUENCY PULLING AT POWER ON

TECHNICAL FIELD OF THE INVENTION

The present invention pertains to oscillators. More specifically, the present invention pertains to high performance oscillators where there is a requirement for minimal response time between turn on and operational stability. The present invention is particularly, but not exclusively, useful for applications where it is necessary to have low phase noise while minimizing the frequency pulling that occurs immediately after DC power is applied.

BACKGROUND OF THE INVENTION

As is well known, an oscillator is an electronic device that provides a source of alternating current. The frequency of the alternating current that is generated by the oscillator is dependent on the characteristics of various components in the oscillator, and may be any frequency. For a stable type oscillator, in which the frequency of a substantially sinusoidal output is determined by a line or tuned circuit, the oscillator uses the principles of positive feedback. One example of such an oscillator incorporates a standard transistor with positive feedback from the collector of the transistor to its base. The oscillations of this oscillator are tuned, or determined, by a grounded crystal oscillator which is connected into the emitter of the transistor. The output of this conventional oscillator is taken from the collector of the transistor.

In the operation of a conventional oscillator as described above, the use of high power drive levels has several advantages. Perhaps the most apparent advantage is that high power drive levels prevent noise degradation in the oscillator by ensuring a relatively high signal to noise ratio. This high drive power will result in a low floor of the oscillator's phase noise spectrum with a resultant improvement is short term stability. On the other hand, there are significant disadvantages associated with the use of high power drive levels.

During a cold power up of a conventional oscillator as described above, high power necessarily causes the crystal to heat up. This generates severe frequency pulling, or "chirping", at turn on which continues until the crystal temperature stabilizes. An adverse consequence of this is that there can be unacceptable response delays during the time interval the oscillator is stabilizing. Further, at the drive levels associated with high power operation, there can be excessive frequency drift after stabilization.

To avoid the problems of "chirping" and frequency drift, the obvious alternative is to operate the oscillator at low power drive levels. It happens, however, that for a conventional oscillator there are generally unacceptable consequences in oscillator operation at low power drive levels. Importantly, because the resistance of the crystal must be higher than the resistance of the transistor's emitter, the power dissipation of the crystal is still relatively high. Furthermore, the noise floor is actually raised by the lower power level and the loaded Q of the crystal in the circuit is degraded. Due to the adverse effects encountered in low power operation of a conventional crystal oscillator, several factors have gone unattended. For example, the problem of frequency pulling at turn on has not been addressed, and the possibility of optimizing the crystal impedance for best Q of the circuit has not been considered.

In light of the above, it is an object of the present invention to provide an oscillator which reduces the power requirement necessary for crystal oscillator drive, through impedance transformation, to achieve low phase noise while minimizing the frequency pulling that occurs immediately after D.C. power is applied to the oscillator. Another object of the present invention is to provide an oscillator which achieves relatively low crystal power dissipation with minimal degradation in the Q of the crystal. Still another object of the present invention is to provide an oscillator which uses the resonator element as a single band pass filter to reduce the wideband oscillator noise. Yet another object of the present invention is to provide an oscillator which uses the impedance of the resonator to provide a frequency dependant load to the input of the buffer stage so that wide band noise is not contributed by the buffer stage. Another object of the present invention is to provide an oscillator which diminishes the long term frequency drift of the oscillator. It is also an object of the present invention to provide an oscillator which is simple to use, relatively easy to manufacture and which is comparatively cost effective.

SUMMARY OF THE INVENTION

A high performance oscillator in accordance with the present invention, which is characterized by low frequency pulling at turn on, includes a resonating element which is electrically connected between an oscillator stage and a buffer stage. When these components are connected together in accordance with the present invention, the low phase noise of the oscillator is reduced. Additionally, this combination minimizes the frequency pulling or "chirping" which occurs immediately after DC power is applied. Thus, there is a reduced response time for operational stability and an acceptable signal to noise ratio.

The buffer stage of the oscillator includes a transistor which is a common base transistor. For the applications of the present invention, the common base transistor is used as a buffer amplifier. The oscillator stage also includes a transistor. The oscillator transistor, however, relies on positive feed back from its collector to its base in order to sustain oscillations. In accordance with the present invention, the resonating element is connected into the emitter of the oscillator transistor and also into the emitter of the common base transistor.

For the oscillator of the present invention, the resonating element is a circuit which has a crystal oscillator connected in parallel with a transformer winding. One node of this circuit is connected directly into the emitter of the oscillator transistor. The connection from the circuit into the emitter of the buffer transistor, however, is not through a circuit node. Instead, this connection is through a tap which electrically connects the emitter of the buffer transistor to the winding in the circuit of the resonating element. Depending on where the tap is connected to the winding, the impedance transformation through the resonating element can be varied as desired. In each case, there is an impedance transformation across the resonating element which allows the crystal oscillator to operate with significantly reduced power dissipation and without a significant degradation in the symbol of merit (Q) for the crystal oscillator.

The output of the oscillator is taken from the collector of the common base buffer transistor. For the combination of the present invention, this output has an enhanced signal to noise ratio for at least two reasons. First, the crystal resonator itself acts as a filter to reduce oscillator noise off resonance. Second, the circuitry of the resonating element establishes a high impedance away from the crystal resonant frequency at the emitter of the buffer amplifier which reduces buffer amplifier noise.

The novel features of this invention, as well as the invention itself, both as to its structure and its operation, will be best understood from the accompanying drawings, taken in conjunction with the accompanying description.

BRIEF DESCRIPTION OF THE DRAWINGS

The novel features of this invention, as well as the invention itself, both as to its structure and its operation will be best understood from the accompanying drawings, taken in conjunction with the accompanying description.

DESCRIPTION OF THE PREFERRED EMBODIMENT

Figure 1:
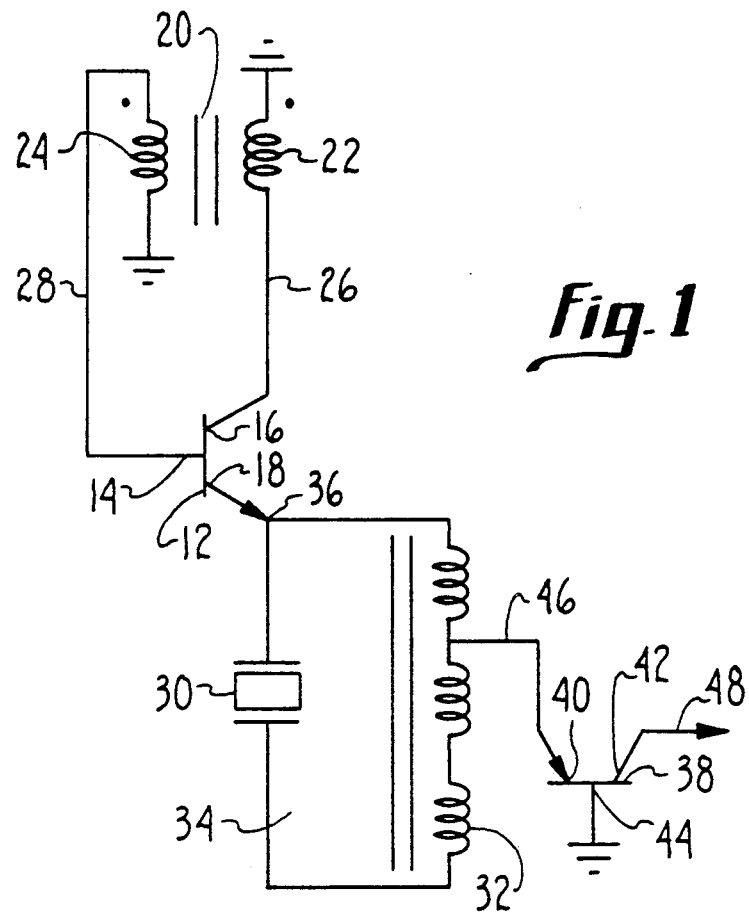
FIG. 1 is an a.c. circuit wiring diagram for the oscillator of the present invention.

Referring initially to FIG. 1, the a.c circuit diagram of an oscillator in accordance with the present invention is shown and generally designated 10. As shown the oscillator 10 includes an oscillator transistor 12 which has a base 14, a collector 16 and an emitter 18. The transistor 12 may be any transistor, or device having equivalent characteristics, well known in the pertinent art. For the particular configuration shown in FIG. 1, transistor 12 would be of the type known as an n-p-n transistor. It is to be noted that although the D.C. bias is not shown in FIG. 1, standard techniques can be used to supply a D.C. voltage and current to the transistors 12, 38.

FIG. 1 also shows that the oscillator 10 includes a transformer 20 which is connected to provide positive feed back for the transistor 12. Together, transistor 12 and transformer 20 comprise the oscillator stage of the present invention. More specifically, transformer 20 has a grounded winding 22 and a grounded winding 24 which are oriented with their like poles opposed to each other. This causes the current in winding 22 to be out of phase with the current in winding 24 to thereby establish a positive feedback. As shown in FIG. 1, winding 22 is connected into the collector 16 of oscillator transistor 12 through line 26, and winding 24 is connected into the base 14 of oscillator transistor 12 through line 28.

A piezoelectric crystal 30 is connected in parallel with a winding 32 to establish a circuit 34 which functions as the resonating element of the oscillator 10. As shown, the node 36 of circuit 34 is connected into emitter 18 of oscillator transistor 12.

For purposes of the present invention, crystal 30 may be of any type well known in the pertinent art. Preferably, however, for the intended frequencies of operation, crystal 30 is of a type commonly referred to in the pertinent art as a seventh overtone crystal. Additionally, though the symbols typical of an iron core transformer are used for the transformer 20 and the winding 32, it is to be appreciated that equivalent structure for these elements would also suffice for purposes of the present invention.

The buffer stage of oscillator 10 comprises a buffer transistor 38 which has an emitter 40, a collector 42 and a base 44. Importantly, transistor 38 is a common base circuit, i.e. base 44 is grounded. With this configuration, the emitter 40 is connected through a tap 46 to the winding 32 of parallel circuit 34. Thus, there is an impedance transformation across the circuit 34 which alters the power dissipated by crystal 30. The particular impedance transformation is a matter of design and will depend, in part, on the particular characteristics of crystal 30.

The output 48 of oscillator 10 is taken off the collector 42 of buffer transistor 38.

When considering the operation of oscillator 10, it is first necessary to consider the effect of impedance transformation which results when tap 46 is connected into winding 32. For example, it can be easily shown that a 3:1 voltage transformation across the circuit 34 causes a 9:1 impedance transformation. Consequently, for example, if the series resistance of crystal 30 is 110 $\Omega$, the 9:1 impedance transformation of circuit 34 converts this resistance to one ninth the series resistance, or approximately 12.22 $\Omega$ at resonance.

Because power can be expressed in terms of current and resistance, there will be a reduction in power requirements due to the impedance transformation.

An expression for power is:

$$P = I^2 R$$

Where;
P = Power,
I = Current, and
R = Resistance.

Thus, an important result for the example here is that there is one ninth the power dissipation at the crystal 30. Additionally, due to the configuration of oscillator 10, the Q of crystal 30 is not significantly degraded. To appreciate this, consider the following:

$$\text{Loaded } Q = \frac{\text{Internal Impedance}}{\text{Total Impedance}} = \frac{R_s}{R_s + R_e}$$

Where:
$R_e$ = Resistance of emitter
$R_s$ = Resistance of crystal

By way of example: for $R_e = 2.6 \, \Omega$ and $R_s = 110 \, \Omega$, the loaded Q for a crystal of a conventional oscillator is:

$$Q = \frac{110}{100 + 2.6} = 97.6\%$$

Using these same componants for a transformed $R_s$ (100/9 = 12.22) and $R_e$ (for both the oscillator and the buffer), loaded Q for a crystal in the oscillator of the present invention will be:

$$Q = \frac{12.22}{12.22 + 2.6 + 2.6} = 70.1\%$$

Figure 2:
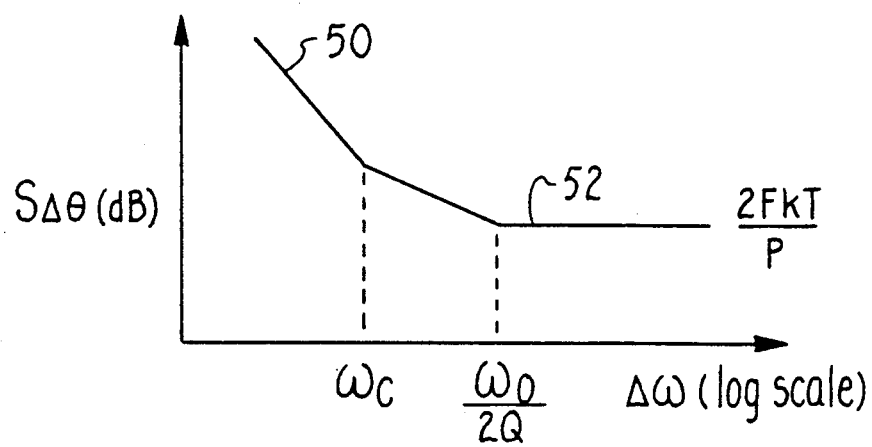
FIG. 2 is a graph showing the predicted output noise spectrum of the oscillator as a function of frequency.

Thus, while power has been lowered by a factor of 9, Q has not been so drastically degraded. The import of the above disclosure will be best appreciated by reference to FIG. 2 wherein the predicted output noise spectrum of a crystal oscillator is shown. The parameters pertinent to the graph 50 shown in FIG. 2 are:

$\omega = 2\pi f$
$f_c$ = Corner frequency of the flicker noise spectrum
$f_o$ = Oscillator center frequency
Q = Loaded Q of the oscillator
F = Noise factor
k = constant
T = Temperature
S = Noise In light of the above, it is to be appreciated that the noise floor 52 is directly proportional to the noise factor F. Stated differently, reduced noise in the system is an objective for lowering the noise floor 52. Additionally, graph 50 shows it is desirable to have a Q which is as high as possible so that the predicted output noise spectrum will more closely approximate a delta spike. The present invention exhibits favorable trends in these desired directions. For instance, the crystal 30, alone, acts as a band pass filter which lowers oscillator noise. Also, the circuit 34 establishes a reactive load for the buffer transistor 38 which reduces sideband noise. At the same time, and as indicated above, the Q of the oscillator crystal 30 is not appreciably degraded.

While the particular high performance oscillator as herein shown and disclosed in detail is fully capable of obtaining the objects and providing the advantages herein before stated, it is to be understood that it is merely illustrative of the presently preferred embodiments of the invention and that no limitations are intended to the details of the construction or design herein shown other than as defined in the appended claims.

We claim:

1. A high performance oscillator which comprises:
   an oscillator transistor having a base, an emitter and a collector;
   a buffer transistor having a base, an emitter and a collector;
   a circuit having a resonator in parallel with a winding, said circuit being electrically connected to said emitter of said oscillator transistor; and
   a tap electrically connecting said emitter of said buffer transistor to said winding to establish a transformed output at said collector of said buffer transistor.

2. An oscillator as recited in claim 1 further comprising a transformer connected between said collector of said oscillator transistor and said base of said oscillator transistor to provide positive feedback for said oscillator transistor to sustain current oscillations from said oscillator.

3. An oscillator as recited in claim 1 wherein said resonator is a crystal resonator.

4. An oscillator as recited in claim 1 wherein said circuit, with said tap connected to said winding, effectively establishes a 9:1 impedance transformation.

5. An oscillator as recited in claim 1 wherein said buffer transistor is a common base transistor.

6. An oscillator as recited in claim 3 wherein said crystal resonator is a seventh overtone crystal.

7. A high frequency oscillator which comprises:
   an oscillator stage having an oscillator transistor;
   a buffer stage having a buffer transistor; and
   a transformer in parallel with a crystal resonator electrically connecting said oscillator stage transistor with said buffer stage transistor for operating said oscillator at a low transformed crystal power level.

8. A high frequency oscillator which comprises:
   an oscillator stage having an oscillator transistor;
   a buffer stage having a buffer transistor; and
   a transformer resonating element electrically connecting said oscillator stage transistor with said buffer stage transistor for operating said oscillator at a low transformed power level;
   wherein said oscillator transistor has a base, an emitter and a collector and said oscillator stage further comprises a transformer connected between said collector of said oscillator transistor and said base of said oscillator transistor to provide positive feedback for said oscillator transistor to sustain current oscillations from said oscillator.

9. An oscillator as recited in claim 8 wherein said buffer transistor has a base, an emitter and a collector and said base of said buffer transistor is grounded.

10. An oscillator as recited in claim 9 wherein said transformer resonating element comprises a circuit having a resonator in parallel with a winding.

11. An oscillator as recited in claim 10 wherein said circuit is electrically connected to said emitter of said oscillator transistor, and said oscillator further comprises a tap electrically connecting said emitter of said buffer transistor to said winding to establish a transformed output at said collector of said buffer transistor.

12. An oscillator as recited in claim 11 wherein said resonator is a crystal resonator.

13. An oscillator as recited in claim 12 wherein said circuit, with said tap connected to said winding, effectively establishes a 9:1 impedance transformation.

14. A high performance oscillator which comprises:
   an oscillator transistor having means for providing positive feedback to sustain operation of said oscillator transistor;
   a resonator electrically connected to said oscillator transistor;
   a winding electrically connected to said oscillator transistor, said winding being connected in parallel with said resonator to establish a circuit with said resonator;
   a buffer transistor; and
   a tap electrically connecting said winding to said buffer transistor to operate said circuit at a transformed power level.

15. An oscillator as recited in claim 14 wherein said oscillator transistor has a base, an emitter and a collector and said means for providing positive feedback is a transformer connected between said collector of said oscillator transistor and said base of said oscillator transistor.

16. An oscillator as recited in claim 15 wherein said buffer transistor has a base, an emitter and a collector, and said base of said buffer transistor is grounded.

17. An oscillator as recited in claim 16 wherein said circuit is electrically connected to said emitter of said oscillator transistor, and said tap electrically connecting said emitter of said buffer transistor to said winding to establish a transformed output at said collector of said collector of said buffer transistor.

18. An oscillator as recited in claim 17 wherein said resonator is a crystal resonator.

19. An oscillator as recited in claim 18 wherein said circuit, with said tap connected to said winding, effectively establishes a 9:1 impedance transformation.

* * * * *